United States Patent
Vashchenko et al.

(10) Patent No.: US 6,952,039 B1
(45) Date of Patent: Oct. 4, 2005

(54) ESD PROTECTION SNAPBACK STRUCTURE FOR OVERVOLTAGE SELF-PROTECTING I/O CELLS

(75) Inventors: Vladislav Vashchenko, Palo Alto, CA (US); Ann Concannon, San Jose, CA (US); Peter J. Hopper, San Jose, CA (US); Marcel ter Beek, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/656,823

(22) Filed: Sep. 4, 2003

Related U.S. Application Data

(63) Continuation-in-part of application No. 10/097,283, filed on Mar. 12, 2002, now abandoned.

(51) Int. Cl.⁷ .............................................. H01L 29/76
(52) U.S. Cl. .................... 257/408; 257/296; 257/336; 257/337; 257/349; 257/412; 257/343
(58) Field of Search ................................ 257/355, 357, 257/360, 378, 406, 407, 405, 408, 336, 367, 257/319, 412, 343, 236

(56) References Cited

U.S. PATENT DOCUMENTS

| | | | |
|---|---|---|---|
| 6,004,849 A * | 12/1999 | Gardner et al. | 438/286 |
| 6,229,182 B1 * | 5/2001 | Van Lieverloo | 257/355 |
| 6,323,074 B1 | 11/2001 | Jiang et al. | |
| 6,365,937 B1 | 4/2002 | Porter et al. | |
| 6,465,768 B1 * | 10/2002 | Ker et al. | 250/214.1 |
| 6,514,839 B1 | 2/2003 | Ker et al. | |
| 6,521,952 B1 | 2/2003 | Ker et al. | |
| 6,661,060 B2 * | 12/2003 | Lee et al. | 257/355 |
| 2001/0012666 A1 | 8/2001 | Hsu | |
| 2002/0055233 A1 | 5/2002 | Mitros | |
| 2002/0145165 A1 | 10/2002 | Yang | |

* cited by examiner

Primary Examiner—Nathan J. Flynn
Assistant Examiner—Fazli Erdem
(74) Attorney, Agent, or Firm—Jurgen Vollrath

(57) ABSTRACT

In a self protection I/O, a multiple gate NMOS structure is designed to shift the avalanche multiplication region away from the edge of the gate nearest the drain. This is achieved by providing a lightly doped region between the edge of the gate and the ballast region of the drain.

8 Claims, 2 Drawing Sheets

ESD PROTECTION SNAPBACK STRUCTURE FOR OVERVOLTAGE SELF-PROTECTING I/O CELLS

This application is a CIP of Ser. No. 10/097,283 filed on Mar. 12, 2002 now abandoned.

FIELD OF THE INVENTION

The invention relates to overvoltage self protecting I/O cells. In particular it relates to cascoded (dual gate) NMOS structures capable of ESD protection by operating in snapback mode.

BACKGROUND OF THE INVENTION

In order to protect integrated circuit devices (ICs) against damage due to electrostatic discharge, it is common to include either separate ESD protection devices for channeling high ESD currents to ground, or to create self protecting I/O cells in which the same device is used as a high current output driver as well as for ESD protection.

In 80% to 90% of CMOS applications, snapback NMOS structures are the protection solution used. These work adequately during pulsed ESD operation but experience difficulties at continuous excessive currents or very high currents. The limited energy dissipation capabilities of NMOS ESD protection clamps can be attributed to the extremely localized region for heat dissipation, which corresponds to approximately a 0.5 $\mu$m region near the gate-drain region. This becomes especially significant in the case of overvoltage cells as is discussed further below.

A typical N-MOS snapback device includes a gate defined by a poly layer, a drain in the form of an n+ region and silicide (cobalt or titanium silicide) and a source. A plot of the IV characteristics of such a snapback device is shown in FIG. 1 and indicated by reference numeral 100. As is shown by the curve 100, current increases virtually unchecked after triggering, and only tapers off at extreme currents due to increased resistance caused by heating. In order to avoid burn-out, it is important not only to limit the current, but also to avoid excessive local current densities. One prior art solution is to use a separation resistance in the form of an un-silicided portion (ballast) between the gate and the silicided drain. The IV characteristics of such an un-silicided portion are shown by curve 102 in FIG. 1, which shows a clear saturation current curve. Thus the ballast region acts as a saturation resistor. The combined effect of including a ballast region for the snapback NMOS device is shown by curve 104 which, in many instances, will provide a current limit as indicated.

However, the use of a ballasting region to act as a saturation resistor fails to adequately address the problems of soft gate leakage current degradation and hot carrier degradation (HCD) which occur not only under high current induced by an ESD pulse, but take place even before breakdown. (HCD is commonly ascribed to post-ESD stress caused by residual high voltage levels after triggering off. In the case of low leakage circuits, these voltage levels may be stored for a long time thereby causing long term overload, causing HCD of the gate oxide.) As mentioned above, NMOS devices are most vulnerable in the region along the edge of the gate oxide under high electric fields, currents, and lattice temperatures. This becomes especially critical in the case of double gate structures due to the larger drain-source spacing, as is discussed below.

NMOS snapback structures operate using strong avalanche multiplication of charge carriers to create conductivity modulation in the on-state. FIG. 2 shows a cross-sectional view that illustrates a conventional NMOS device. As shown in FIG. 2, NMOS 200 has gates 202, 204 formed on a p-type semiconductor material 206. Considering only the NMOS device defined by the gate 204, FIG. 2, further, shows a n-doped drain 210 and n-doped source 212 extending along the sides of the gate 204. In operation, when the voltage across the drain 210 and source 212 is positive but less than the trigger voltage, the voltage reverse biases the junction between the gate 204 and the n-type material of the drain 210 and source 212. The reverse-biased junction blocks charge carriers from flowing from drain to source in the absence of appropriate biasing of the gate. However, when the voltage across the drain and source is positive and equal to or greater than the trigger voltage, the reverse-biased junction breaks down due to avalanche multiplication causing holes to be injected into the region beneath the gate 204. The increased number of holes increases the potential of the material beneath the gate 204 and eventually forward biases the junction between the gate and the source, causing the holes to be swept across the junction to be collected by the source 212. Similarly, electrons are swept across from the source to the drain. Some of the electrons injected into the region below the gate 204 recombine with holes and are lost while another part of the holes is lost through the substrate contact.

However, in the case of overvoltage cells, cascoded NMOS devices are commonly used to increase the operating voltage (for example to increase the operating voltage from 3.3 V to 5V.) Referring again to FIG. 2, if the structure were connected as a set of two cascoded devices with a dual gate, the gates 202 and 204 would serve as the gates of the cascoded structure, and the region 220 would act as the source, with the region 210 serving as the drain. However, in such a structure the drain-source spacing between the drain 210 and source 220 is considerably greater. For instance, in a 0.181 $\mu$m CMOS dual gate oxide process, the spacing will be approximately 1.2 $\mu$m. This causes more charge carriers to be lost instead of being swept across the junction. Consequently, a higher electric field is required for avalanche multiplication. The resultant higher electric field E, lattice temperature, and input ionization at the gate 204 exposes the region along the edge of the gate 204 to higher soft gate leakage current degradation and hot carrier degradation. The present invention proposes a new structure and method of reducing such degradation.

SUMMARY OF THE INVENTION

The present invention proposes a new structure for a self protection I/O using a multiple gate NMOS structure in which the electric field in the gate region is redistributed by changing the junction profile. This is achieved by providing a lightly doped region between the edge of the gate and the ballast region of the drain, wherein the lightly doped region is of approximately the same length as the junction depth.

According to the invention there is provided a dual gate NMOS device, comprising a drain, a source, at least two gates between the drain and the source, and a lightly doped region having a lower doping level than the drain, extending between the drain and the gate that is adjacent the drain for a distance that is substantially the same as the depth of the drain. Preferably, the lightly doped region extends from the edge of the gate that lies closest to the drain for said gate that is adjacent the drain. The device typically includes a drain silicide, wherein the drain defines a n+ drain ballasting region extending between the drain silicide and the lightly doped region. Preferably the length of the lightly doped region is between 0.18 µm and 0.5 µm, and ideally below 0.25 µm.

Further, according to the invention, there is provided a method of reducing soft leakage current degradation in a NMOS snapback device, comprising redistributing the electric field in the gate region and changing the junction profile by providing for a n-lightly doped region between the gate and the n+ drain of the device, that has a length substantially the same as the n+ drain depth. Preferably the lightly doped region is formed from an NLDD region by masking a region between the gate and the drain during n+ doping of the drain. The n-lightly doped region may extend substantially from the edge of the gate for 0.18 µm–0.5 µm, and preferably for 0.18 µm –0.25 µm. The masks may comprise standard masks used in the process such as n+ composite and silicide exclusion masks. The NMOS device may be a multiple gate device in which the lightly doped region is located between the drain and the gate nearest the drain.

DETAILED DESCRIPTION OF THE INVENTION

Figure 1:
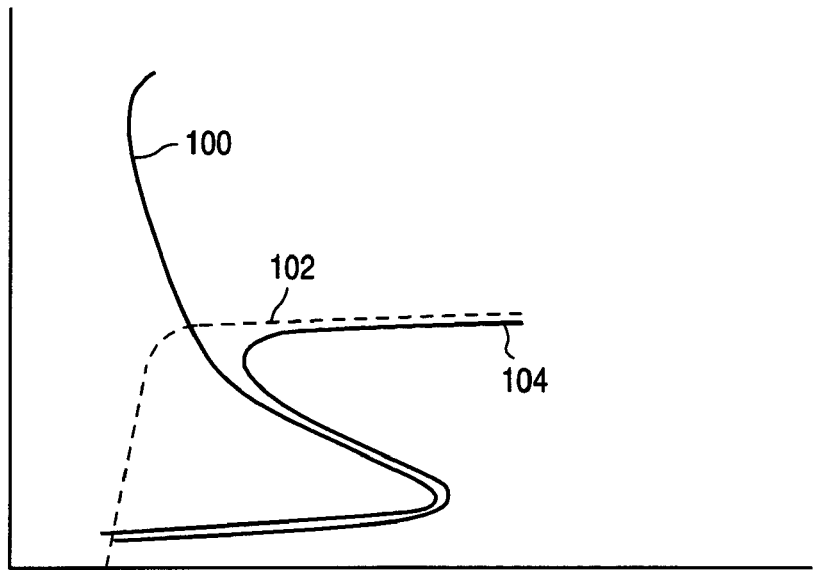
FIG. 1 is a set of prior art IV curves.
Figure 2:
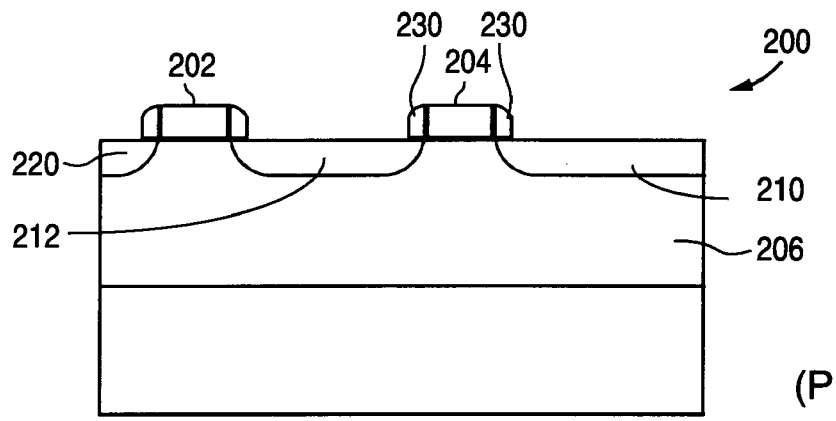
FIG. 2 is a sectional view through a prior art NMOS device.

The present invention proposes reducing the soft gate leakage current degradation under ESD stress, and hot carrier degradation adjacent the edge of the gate by redistributing the electric field in the gate region by changing the junction profile to deal with high ESD current densities. This is achieved by using a blocking mask to block off a portion of the drain composite region during n+ doping of the drain composite. This leaves the lightly doped region (NLDD) in the blocked off region near the gate to, in effect, create a graded junction in the gate vicinity. In contrast, as shown in FIG. 2, the prior art simply makes use of nitride spacers 230 to block off a short NLDD region of 0.1–0.15 during n+ doping of the drain composite. This small nitride blocking region is adopted to avoid shorting out of the drain and source during creation of the n+ regions of the drain and source.

The present invention, on the other hand, proposes to specifically use photoresist and a blocking mask to block off a region of 0.18–0.5 µm and preferably of 0.18–0,25 µm extending from the edge of the gate closest to the drain (indicated by reference numeral 420 in FIG. 4) towards the drain 400, using a blocked off region (NLDD length) that is substantially the same as the depth of the n+ drain, so that the profile of the junction between the drain and the gate is changed to a graded junction. It is important not to choose too great an NLDD length since this leads to excessive saturation resistance and localized heating. The blocking leaves a lightly doped region where the resist blocked the n+implantation, which is similar in length and depth. Thus, in this embodiment which is discussed further below, the enlarged lightly doped region of the invention is an extension of the lightly doped region of the prior art, and is formed by masking off said lightly doped region during n+ doping of the drain and source. In another embodiment, instead of making use of the existing lightly doped region, a separate, new, additional lightly doped region is formed using a separate doping step. This new additional lightly doped region of the invention may have the same or a higher doping level than the lightly doped region known in prior art CMOS devices. One prior art structure shown in U.S. 2002/0145165 A1 to Yang provides a lightly doped region between a heavily doped region and a gate. However, Yang does not provide for a graded junction profile. Instead, as described in paragraph 0077 and again in paragraph 0093, the heavily doped drain area is formed sufficiently far from the gate electrode to secure a necessary resistance from the gate electrode. In particular, Yang, in FIG. 3B, shows a distance of 1 µm. This long lightly doped region is necessitated in Yang since Yang seeks to reduce the overall size of the device and compensate for the resultant reduction in resistance of the smaller drain by introducing a large lightly doped region, In this way it achieves its desired purpose of reducing input capacitance (paragraph 0105). In contrast, the present invention addresses the issue of soft gate leakage current by proposing a graded junction profile to redistribute the electric field in the gate region. This is achieved by providing a lightly doped region between the n+ drain and the gate, which is approximately of the same length as the drain depth. For consistency of terminology, the drain will be described as comprising a n+ drain region or n+ drain ballast region (reference numeral 400 in FIG. 4), and a drain silicide (reference numeral 410 in FIG. 4) over part of the drain ballast region, which provides a region for the drain contact. It will be noted that the depth of the drain or drain ballast region is the same as the depth of the lightly doped region (NLDD) (reference numeral 406 in FIG. 4).

Figure 3:
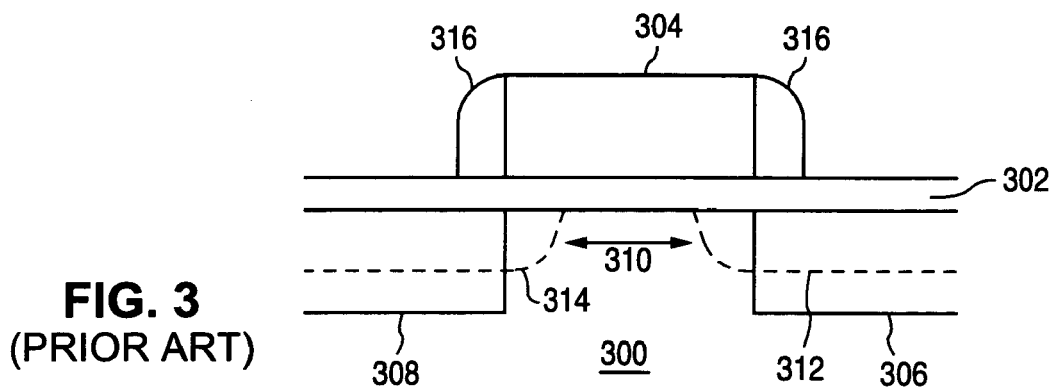
FIG. 3 is a detailed sectional view through a prior art NMOS device.

The first-mentioned embodiment will now be discussed in greater detail. In order to avoid unnecessary cost increases in implementing an NMOS structure of the invention, it is desirable that existing process steps be incorporated as much as possible. FIG. 3 illustrates a typical NMOS device which includes a p-well or substrate 300, an oxide layer 302, and a polygate 304. The drain region 306 and source region 308 are formed in the substrate 300 by introducing n dopants to define the drain and source 306, 308 separated by a minimal gap 310. The minimal dimension gap 310 which separates the two n+ regions 306, 308 typically possesses certain process difficulties due to the risk of dopant contamination. In order to avoid n dopant contamination in the gap 310 when implanting the n+ regions of the drain and source, lightly doped regions 312, 314 are first diffused into the well or substrate 300, using the gate poly 304 as a mask. Thereafter, nitride spacers 316 are formed on either side of the gate poly 304 by depositing nitride over the entire structure and etching away the nitride to a certain depth. The high concentration n+ is then implanted using the nitride spacers 316 as a mask. Typically, the high concentration n+ regions have doping levels that are approximately 100 times greater than the lightly doped regions. This process of first using lightly doped regions to avoid contamination is common in the art and, in the case of the drain, the region is typically referred to as a NLDD (lightly doped drain) region.

As mentioned above, the present invention provides for the creation of an additional or enlarged lightly doped region adjacent the gate 304. In one embodiment of the invention, the extended lightly doped region adjacent the gate 304 is formed by using masks that are already being used in the manufacturing process, such as the n+composite blocking and silicide exclusion masks, to block n-dopant in the region adjacent the gate during implantation of the n+ drain and source regions 306, 308. Thus the prior art NLDD region 312 is used to define the new enlarged lightly doped region of the invention adjacent the gate 304.

Figure 4:
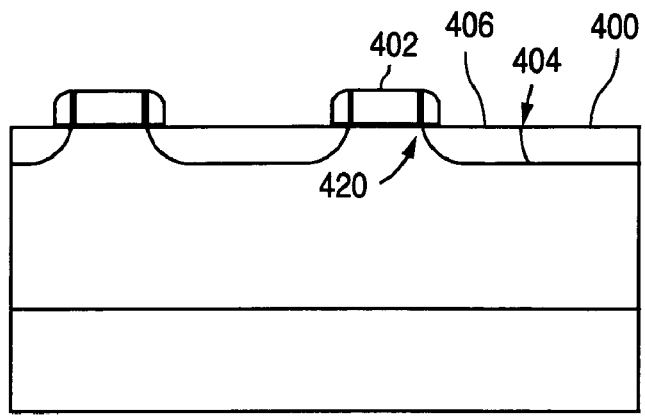
FIG. 4 is a sectional view through one embodiment of a NMOS device of the invention.

The effect of masking off an enlarged region adjacent the gate during n+ implantation is to avoid implantation of highly doped n+ material near the gate, as illustrated in FIG. 4. This leaves only lightly doped material between the gate 402 and the location 404. Thus a spacer in the form of a lightly doped n-region 406 is created between the gate edge and the drain composite region 400. The resultant current saturation in the lightly doped spacer region 406 is of the order of 1 mA/mm, causing the maximum electric field E to be redistributed and fall outside the gate corner. This also causes lattice temperature under the gate, hot carrier density, and the effective temperature to be reduced, which increases the operating range of the device and reduces soft leakage degradation failures.

Figure 5:
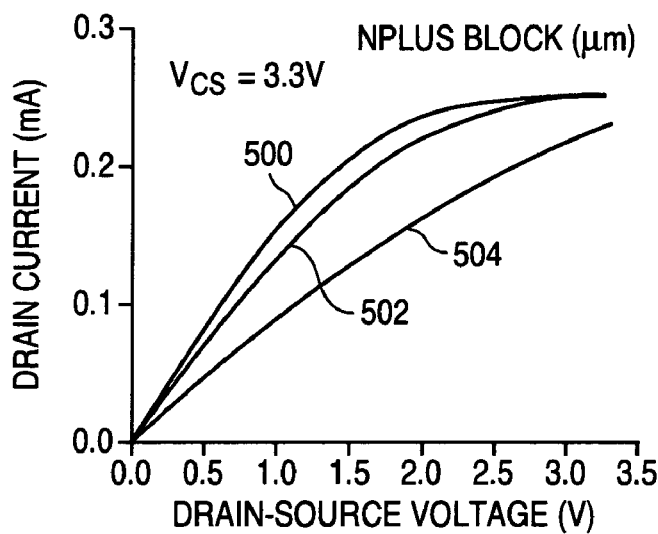
FIG. 5 shows drain current to drain-source voltage curves under low voltage conditions.

Under normal operation when the voltage is low, some parasitic effect due to dumping of the drain saturation current caused by the lightly doped region 406 occurs. However, in the present embodiment, in which a 0.18 $\mu$m CMOS DGO process was used, it was found that the parasitic effect under normal operation is negligible if the spacer region 406 is kept below 0.5 $\mu$m. FIG. 5 shows drain current to drain-source voltage curves for various lengths of the lightly doped region 406 to show the effect on drain saturation current. The gate-source voltage was kept at 3.3 V in this analysis. Curve 500 shows a prior art curve with no lightly doped region. Curves 502 and 504 illustrate the effect of introducing a lightly doped region of 0.3 $\mu$m and 1.3 $\mu$m, respectively. Since the drain saturation current does not change significantly, especially below 0.5 $\mu$m, the structure of the invention is ideally suited for use in the design of self protection I/Os.

Figure 6:
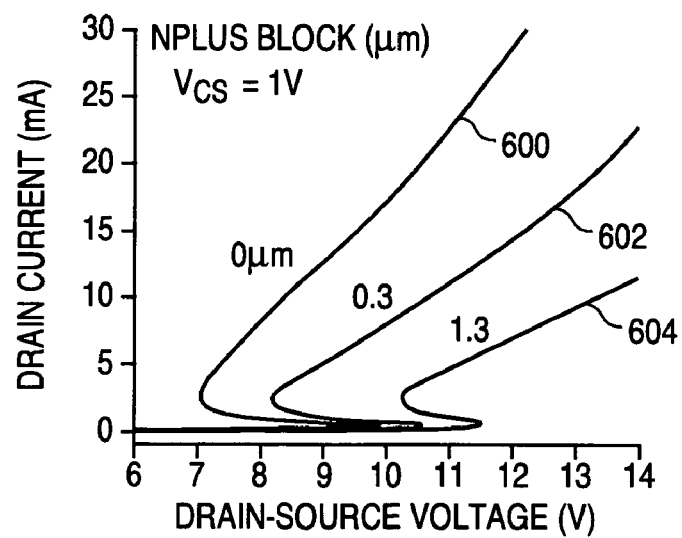
FIG. 6 shows drain current to drain-source voltage curves under snapback conditions.

FIG. 6, in turn, shows drain current to drain-source voltage curves under high voltage conditions to illustrate that the device still operates effectively under ESD conditions. While the present invention has been described with respect to a 0.18 $\mu$m process and a particular embodiment was discussed in which the lightly doped region was created by masking off a region during n+ doping, it will be appreciated that the invention can be implemented for other technologies and using different approaches to forming a lightly doped region, without departing from the scope of the invention.

What is claimed is:

1. A dual gate NMOS device, comprising
a drain,
a source,
a first gate between the drain and the source,
a second gate between the drain and the source, wherein the first gate is closer to the drain and the second gate is closer to the source, and
a lightly doped n-type region having a lower doping level than the drain, extending towards the drain from the gate edge that lies closest to the drain for the first gate, wherein the drain includes a drain silicide and a n+ drain ballasting region extending between the drain silicide and the lightly doped region.

2. A device of claim 1, wherein the length of the lightly doped region is between 0.18 $\mu$m and 0.25 $\mu$m.

3. A device of claim 1, wherein the lightly doped region extends from the drain to the first gate.

4. A method of reducing soft leakage current degradation in a NMOS snapback device that has at least one gate, a n+ drain and a n+ source, comprising
providing for a n-lightly doped region between the gate and the n+ drain of the device, that has a length substantially the same as the n+ drain depth, wherein the n-lightly doped region is formed from an NLDD region by masking a region between the gate and the drain during n+ doping of the drain.

5. A method of claim 4, wherein the n-lightly doped region is formed to extend substantially from the edge of the gate for 0.18 $\mu$m–0.5 $\mu$m.

6. A method of claim 5, wherein the n-lightly doped region is formed to extend substantially from the edge of the gate for 0.18 $\mu$m–0.25 $\mu$m.

7. A method of claim 4, wherein the mask comprises a standard mask used in the process such as n+ composite and silicide exclusion mask.

8. A method of claim 1, wherein the NMOS device is a multiple gate device in which the lightly doped region is located between the drain and the gate nearest the drain.

* * * * *